United States Patent
Oh et al.

(10) Patent No.: US 8,598,952 B2
(45) Date of Patent: Dec. 3, 2013

(54) VOLTAGE VARIABLE TYPE DIGITAL AUDIO AMPLIFYING DEVICE FOR NOISE COMPENSATION AND METHOD THEREOF

(71) Applicant: Pulsus Technology Inc., Pohang-si (KR)

(72) Inventors: Jong Hoon Oh, Seoul (KR); Il Suk Ko, Gimpo-si (KR)

(73) Assignee: Pulsus Technology Inc., Pohang-si (KR)

( * ) Notice: Subject to any disclaimer, the term of this patent is extended or adjusted under 35 U.S.C. 154(b) by 0 days.

(21) Appl. No.: 13/939,875

(22) Filed: Jul. 11, 2013

(65) Prior Publication Data

US 2013/0293299 A1  Nov. 7, 2013

Related U.S. Application Data

(63) Continuation of application No. PCT/KR2011/009215, filed on Nov. 30, 2011.

(30) Foreign Application Priority Data

Jan. 11, 2011  (KR) .................. 10-2011-0002638

(51) Int. Cl.
    *H03G 3/20* (2006.01)
(52) U.S. Cl.
    USPC ........................... 330/136; 330/297

(58) Field of Classification Search
    USPC .................. 330/129, 136, 10, 297, 285, 296
    See application file for complete search history.

(56) References Cited

U.S. PATENT DOCUMENTS

| 5,105,164 | A | 4/1992 | Fisher et al. | |
|---|---|---|---|---|
| 6,373,340 | B1 * | 4/2002 | Shashoua | 330/297 |
| 7,696,818 | B2 * | 4/2010 | Kunihiro et al. | 330/10 |
| 7,859,336 | B2 * | 12/2010 | Markowski et al. | 330/136 |
| 2002/0094795 | A1 | 7/2002 | Mitzlaff | |
| 2010/0219888 | A1 * | 9/2010 | Lesso | 330/136 |
| 2010/0237937 | A1 | 9/2010 | Nagatani et al. | |

FOREIGN PATENT DOCUMENTS

| KR | 10-0166363 | 3/1999 |
|---|---|---|
| KR | 10-2010-0105487 | 9/2010 |

OTHER PUBLICATIONS

Int'l. Search Report issued in Int'l. App. No. PCT/KR2011/009215, mailed May 31, 2012.

* cited by examiner

Primary Examiner — Henry Choe
(74) Attorney, Agent, or Firm — Greer, Burns & Crain, Ltd.

(57) ABSTRACT

The present invention relates to a voltage variable type digital audio amplifying device for noise compensation and a method therefor, and more specifically, varies the power according to an audio input signal, and compensates for the noise generated when varying the power, thereby enhancing audio output efficiency and easily removing noise.

11 Claims, 7 Drawing Sheets

VOLTAGE VARIABLE TYPE DIGITAL AUDIO AMPLIFYING DEVICE FOR NOISE COMPENSATION AND METHOD THEREOF

This is a Continuation of International Application No. PCT/KR2011/009215, filed Nov. 30, 2011.

FIELD OF THE INVENTION

The present invention relates to a voltage variable type digital audio amplifying device for noise compensation and a method thereof, and more particularly, relates to a voltage variable type digital audio amplifying device for noise compensation and a method thereof, by which it is possible to easily remove noise while improving audio output efficiency by varying power according to an audio input signal and compensating for noise generated when the power is varied.

BACKGROUND OF THE INVENTION

An audio amplifier mainly uses a class AB amplifier and a class D amplifier. The efficiency of each amplifier is illustrated in FIG. 1.

FIG. 1 is an exemplary diagram of the efficiency of general class AB amplifier and class D amplifier.

As illustrated in FIG. 1, the class D amplifier has an output efficiency significantly higher than that of the class AB amplifier. A general class A or AB amplifier has an efficiency of approximately 20% to 50%. The loss of efficiency results in heat at an amplifier output terminal, and a heat sink plate is required for cooling. As a consequence, the class A or AB amplifier has high power loss, and since it is heavy and large, it is not portable.

The class D amplifier has high output efficiency at high output levels, but has low output efficiency at low output levels. In reality, the audio amplifier mainly operates at low output level rather than maximum output level. Therefore, a technology for maintaining high output efficiency at low output levels is very required. In this regard, the class D amplifier varies power to realize high output efficiency, regardless of audio output.

FIG. 2 is an exemplary diagram of the efficiency of the general class D amplifier according to a power supply voltage.

The audio amplifier varies power to maintain a high efficiency. As illustrated in FIG. 2, in the case where a power supply voltage is a power supply voltage 1 (H1), a power supply voltage 2 (H2), a power supply voltage 3 (H3), and a power supply voltage 4 (H4), when audio output is constant, the audio amplifier may have high output efficiency as the power supply voltage is increased.

However, when the power is varied, noise is generated in the audio output signal that is output from the audio amplifier. The maximum output of the audio amplifier is obtained by dividing the square of the power supply voltage of the audio amplifier by the resistance value of a load, as expressed by Equation 1 below. When the power supply voltage of the audio amplifier is instantaneously varied, the output of the audio signal varies and noise is generated. When the efficiency of the audio amplifier is assumed to be 100%, the audio output may be calculated using Equation 1 below.

$$O = (V \times V_{in}/V_{max\ in})^2 / R \qquad \text{Equation 1}$$

In Equation 1 above, 0 denotes audio output, V denotes an audio supply voltage, $V_{in}$ denotes audio input, $V_{max\ in}$ denotes a maximum audio input value, and R denotes a load resistance.

As expressed by Equation 1 above, when the audio supply voltage is varied, the audio output also varies. At this time, when the audio supply voltage is rapidly varied, noise is generated.

DETAILED DESCRIPTION OF THE INVENTION

Technical Problem

Accordingly, the present invention has been made in order to solve the above problems occurring in the related art, and is intended to provide a voltage variable type digital audio amplifying device for noise compensation and a method thereof, by which it is possible to easily remove noise while improving audio output efficiency by varying power according to an audio input signal and compensating for noise generated when the power is varied.

Technical Solution

According to an aspect of the present invention, there is provided a voltage variable type digital audio amplifying device for noise compensation, comprising:

an amplitude detection unit configured to detect an amplitude of an audio input signal;

a noise compensation unit configured to scale the audio input signal according to a noise compensation scale;

a pulse width modulation conversion unit configured to convert the scaled audio input signal to a pulse width modulation signal;

an amplification unit configured to amplify the converted pulse width modulation signal according to a power supply voltage;

an output unit configured to demodulate the amplified pulse width modulation signal through an output filter, and output an audio output signal;

a power variation unit configured to vary the power supply voltage; and a power variation control unit configured to generate power variation control information for controlling power variation in the power variation unit according to the detected amplitude, wherein the noise compensation unit determines the noise compensation scale according to the generated power variation control information.

According to another aspect of the present invention, there is provided a voltage variable type digital audio amplifying method for noise compensation, comprising:

an amplitude detection step of detecting an amplitude of an audio input signal;

a power variation step of varying a power supply voltage according to the detected amplitude;

a noise compensation step of determining a noise compensation scale according to the varied power supply voltage, and scaling the audio input signal according to the determined noise compensation scale;

a pulse width modulation conversion step of converting the scaled audio input signal to a pulse width modulation signal;

an amplification step of amplifying the converted pulse width modulation signal according to the varied power supply voltage; and an output step of demodulating the amplified pulse width modulation signal through an output filter, and outputting an output audio signal.

Advantageous Effects

According to the present invention, power is varied according to an audio input signal, so that it is possible to amplify a digital audio signal with high efficiency.

Furthermore, according to the present invention, a digital audio signal is amplified with high efficiency and noise generated when power is varied is compensated, so that it is possible to easily remove the noise while improving audio output efficiency.

DESCRIPTION OF THE MAIN REFERENCE NUMERALS IN DRAWINGS

Figure 1:
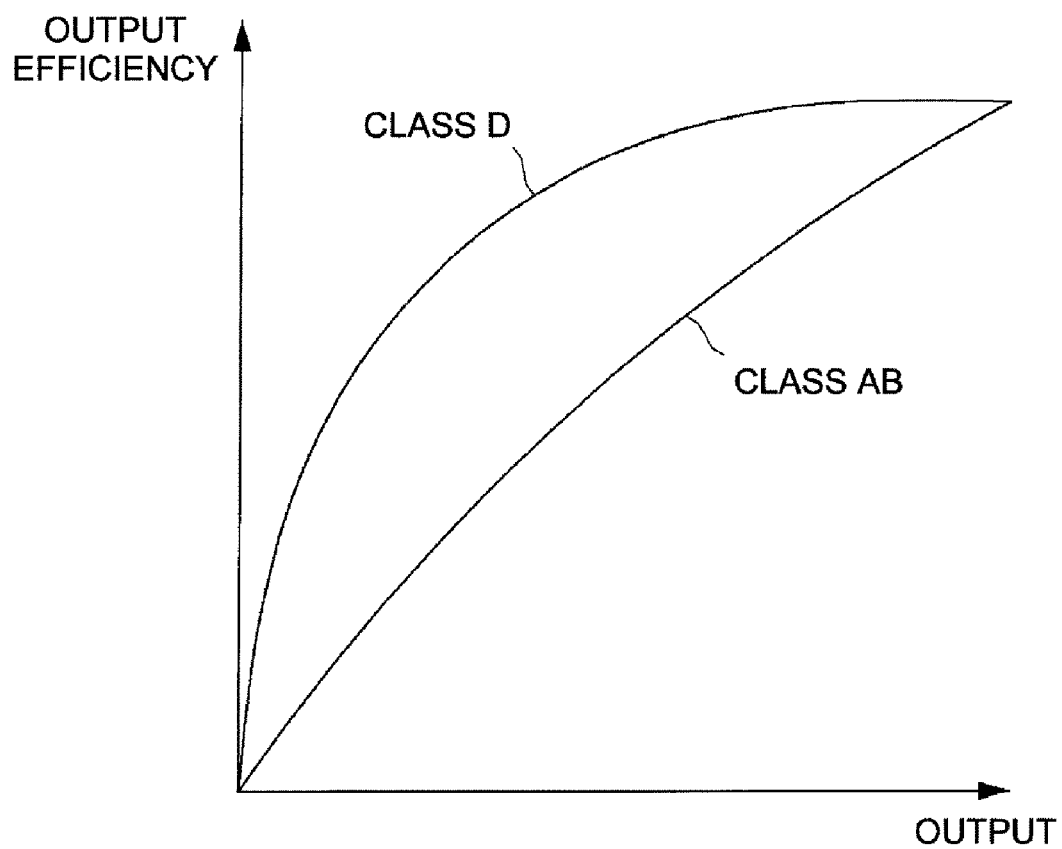
FIG. 1 is an exemplary diagram of the efficiency of general class AB amplifier and class D amplifier.
Figure 2:
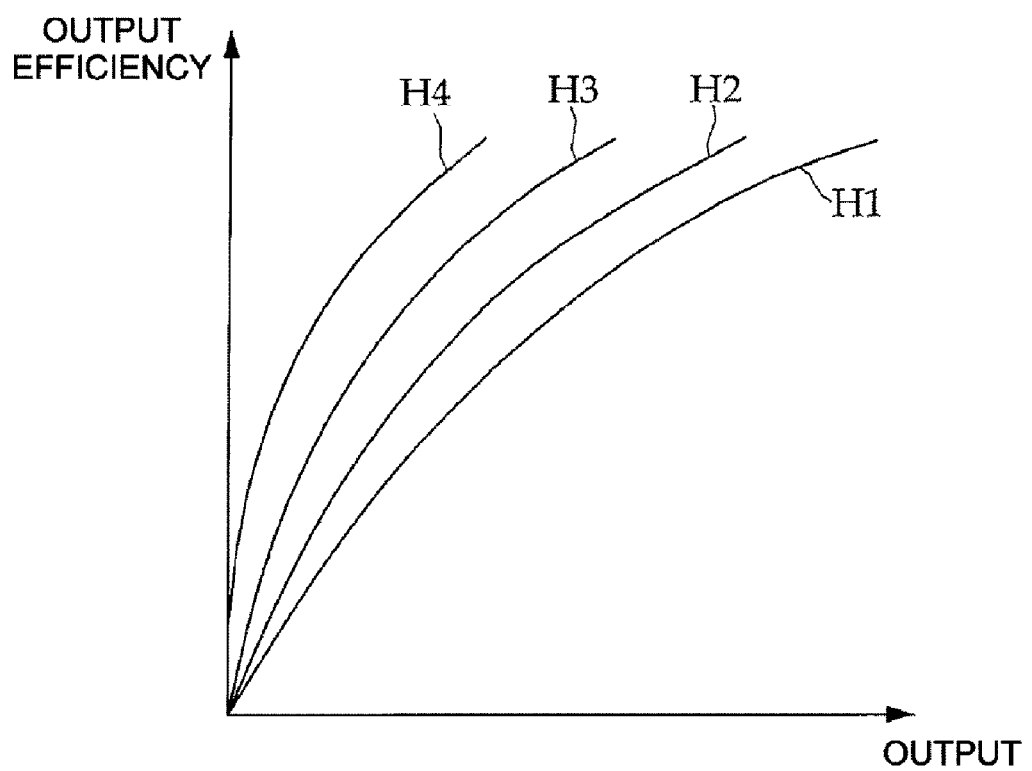
FIG. 2 is an exemplary diagram of the efficiency of a general class D amplifier according to a power supply voltage.

300: digital audio amplifying device
310: amplitude detection unit
320: power variation control unit
330: noise compensation unit
340: pulse width modulation conversion unit
350: power variation unit
360: amplification unit
370: output unit
331: noise compensation scaler
332: multiplier
301: speaker

EMBODIMENTS OF THE INVENTION

Hereinafter, exemplary embodiments of the present invention will be described in detail with reference to the accompanying drawings. The configuration and operation effects of the present invention will be apparent from the following detailed description. Before a detailed description of the present invention, the same reference numerals are used to designate the same elements even though they are illustrated in other drawings, and when it is determined that the well-known configuration departs from the gist of the present invention, a detailed description thereof will be omitted.

Figure 3:
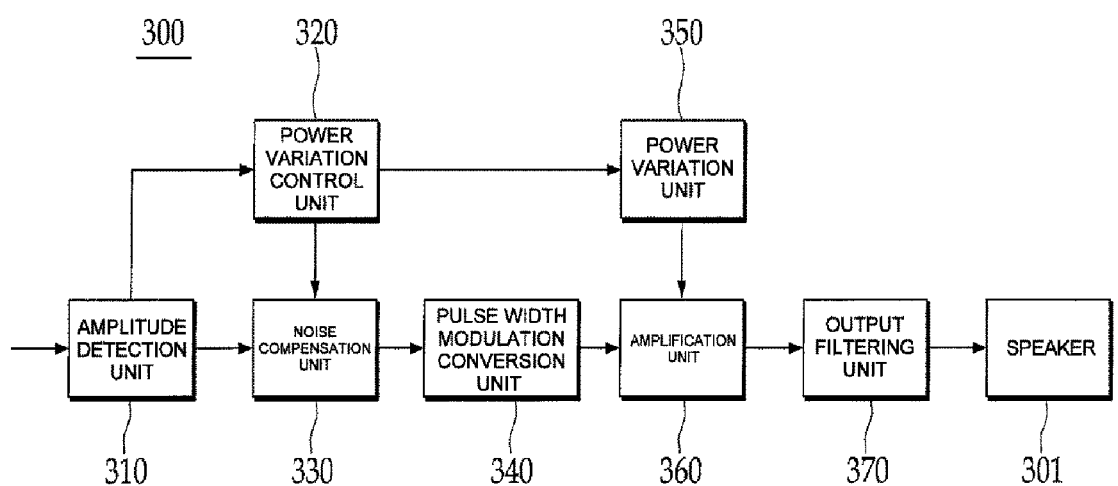
FIG. 3 is a configuration diagram of a voltage variable type digital audio amplifying device for noise compensation in accordance with an embodiment of the present invention.

FIG. 3 is a configuration diagram of a voltage variable type digital audio amplifying device for noise compensation in accordance with an embodiment of the present invention.

As illustrated in FIG. 3, a voltage variable type digital audio amplifying device 300 in accordance with the present invention includes an amplitude detection unit 310, a power variation control unit 320, a noise compensation unit 330, a pulse width modulation conversion unit 340, a power variation unit 350, an amplification unit 360, and an output unit 370. The digital audio amplifying device 300 is connected to a speaker 301, and the speaker 301 outputs an audio output signal that is transferred from the output unit 370.

Hereinafter, the elements of the voltage variable type digital audio amplifying device 300 in accordance with the present invention will be described.

The amplitude detection unit 310 detects the amplitude of an audio input signal that is input to the digital audio amplifying device 300. The amplitude detection unit 310 measures the amplitude of the audio input signal and transfers amplitude information on the audio input signal to the power variation control unit 320.

The power variation control unit 320 determines a power supply voltage to be varied according to the amplitude of the audio input signal detected by the amplitude detection unit 310, generates power variation control information including the determined power supply voltage, and controls the power variation unit 350 and the noise compensation unit 330. The power variation control information may include a varied power supply voltage, information on a variable time, and the like, as well as a power supply voltage to be varied.

The noise compensation unit 330 scales the audio input signal, which is input to the digital audio amplifying device 300, according to a noise compensation scale. The noise compensation unit 330 determines the noise compensation scale according to the power variation control information generated by the power variation control unit 320.

The pulse width modulation conversion unit 340 converts the audio input signal scaled by the noise compensation unit 330 to a pulse width modulation signal.

The power variation unit 350 varies the power supply voltage according to the power variation control information generated by the power variation control unit 320, and applies the varied power supply voltage to the amplification unit 360. The power variation unit 350 varies a driving power supply voltage, which is required for driving the amplification unit 360, according to a control of the power variation control unit 320.

The amplification unit 360 amplifies the pulse width modulation signal, which has been converted by the pulse width modulation conversion unit 340, according to the power supply voltage varied by the power variation unit 350.

The output unit 370 demodulates the pulse width modulation signal, which has been amplified by the amplification unit 360, through an output filter, and outputs the demodulated audio output signal.

Meanwhile, the process by which the noise compensation unit 330 determines the noise compensation scale according to the power variation control information, will be described in detail with reference to first and second embodiments.

First, it is assumed that when an audio supply voltage A is applied to the amplification unit 360, audio output A is output through the output unit 370 as expressed by Equation 2 below, and when an audio supply voltage B is applied to the amplification unit 360, audio output B is output through the output unit 370 as expressed by Equation 2 below.

$$O_A = (V_A \times V_{in}/V_{max\ in})^2/R$$

$$O_B = (V_B \times V_{in}/V_{max\ in})^2/R \qquad \text{Equation 2}$$

In Equation 2 above, $O_A$ denotes audio output A, $V_A$ denotes an audio supply voltage A, $V_{in}$ denotes audio input, $V_{max\ in}$ denotes a maximum audio input value, R denotes a load resistance, $O_B$ denotes audio output B, and $V_B$ denotes an audio supply voltage B.

In the case where the noise compensation scale of the noise compensation unit 330 is applied in accordance with the first embodiment, the audio output A and the audio output B are output as expressed by Equation 3 below.

$$O_A = (S_{NA} \times V_A \times V_{in}/V_{max\ in})^2/R$$

$$O_B = (S_{NB} \times V_B \times V_{in}/V_{max\ in})^2/R \quad \text{Equation 3}$$

In Equation 3 above, $O_A$ denotes audio output A, $V_A$ denotes an audio supply voltage A, $V_{in}$ denotes audio input, $V_{maxin}$ denotes a maximum audio input value, R denotes a load resistance, $O_B$ denotes audio output B, $V_B$ denotes an audio supply voltage B, $S_{NA}$ denotes a noise compensation scale A, and SNB denotes a noise compensation scale B.

When the power variation control unit 320 controls the audio supply voltage A to be varied to the audio supply voltage B, the noise compensation unit 330 determines the noise compensation scale by using the power supply voltage ratio between the power supply voltages A and B as expressed by Equation 4 below in order to allow the audio output A and the audio output B to be equal to each other. That is, the noise compensation unit 330 may determine the noise compensation scale by using the power supply voltage ratio of a varied power supply voltage to a power supply voltage before being varied, which are included in the power variation control information. Furthermore, the noise compensation unit 330 may vary the power supply voltage ratio of the varied power supply voltage to the power supply voltage before being varied, thereby determining the noise compensation scale.

$$O_A = (S_{NA} \times V_A \times V_{in}/V_{max\ in})^2/R$$

$$O_B = (S_{NB} \times V_B \times V_{in}/V_{max\ in})^2/R \quad \text{Equation 4}$$

In Equation 4 above, $S_{NA}$ denoting the noise compensation scale A is 1 and $S_{NB}$ denoting the noise compensation scale B is $V_A/V_B$.

In the second embodiment, the power of the power variation unit 350 is varied according to the power variation control information generated by the power variation control unit 320, and is used for varying audio output. In the first embodiment, although the power is varied, the audio output is not varied. In the second embodiment, when the power is varied, the audio output is varied to compensate for noise. That is, when the audio supply voltage A is controlled to be varied to the audio supply voltage B by the power variation control unit 320 and the varied supply voltage is used for changing audio output, noise compensation is performed.

Accordingly, when the supply voltage is varied, the noise compensation unit 330 may determine the noise compensation scale as expressed by Equation 5 below such that the audio output signal is increased or decreased gradationally according to a cumulative variable time.

$$O_A = (S_{NA} \times V_A \times V_{in}/V_{max\ in})^2/R$$

$$O_B = (S_{NB} \times V_B \times V_{in}/V_{max\ in})^2/R$$

$$S_N = ((1 - \text{compensation factor}) \times V_A + \text{compensation factor} \times V_B)/V_B \quad \text{Equation 5}$$

In Equation 5 above, $S_N$ denotes a noise compensation scale, the compensation factor denotes "weighted value× time", the maximum value of the compensation factor is 1, and the weighted value denotes a value smaller than 1.

In Equation 5 above, when the compensation factor is added and the supply voltage is instantaneously varied, the noise compensation unit 330 operates similarly to the first embodiment.

However, as the time goes by, the compensation factor obtained by multiplying the weighted value and the time becomes increased, and the noise compensation scale gradually approaches 1. Consequently, the audio output B is varied when the power is varied, and supply voltage variable noise is also removed.

In Equation 5 above, the noise compensation unit 330 varies a preset compensation weighted value, thereby varying a ratio at which the audio output signal is increased or decreased gradationally according to the cumulative variable time.

Figure 4:
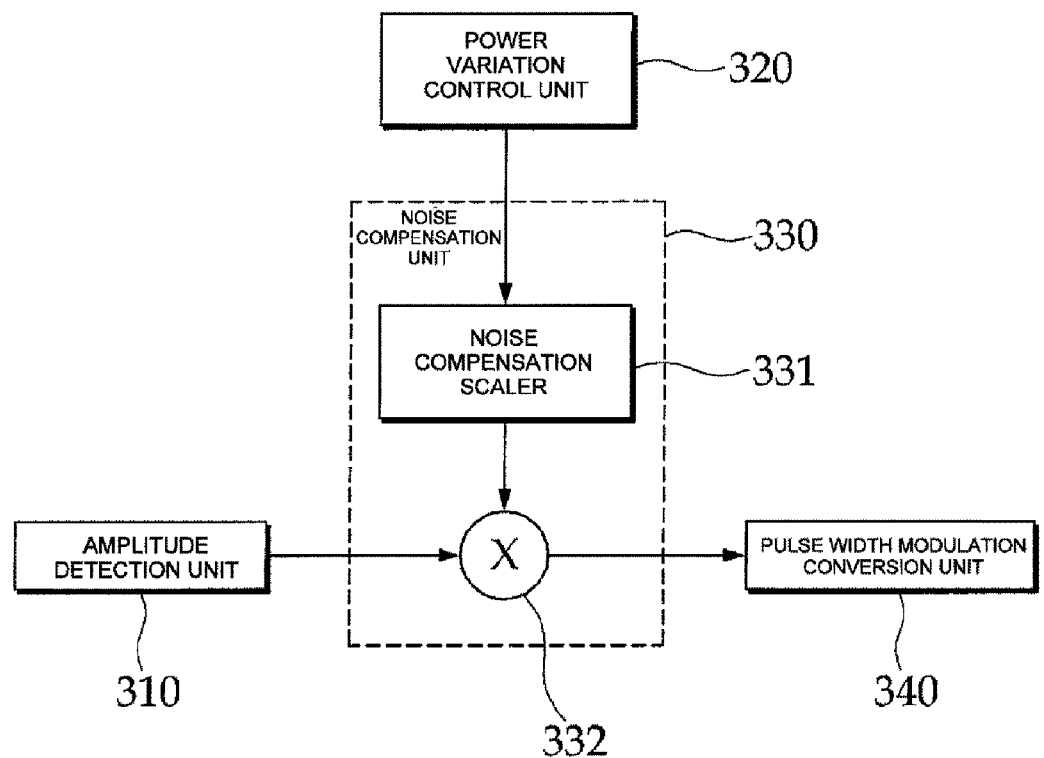
FIG. 4 is a detailed configuration diagram of a noise compensation unit of FIG. 3 in accordance with an embodiment of the present invention.

FIG. 4 is a detailed configuration diagram of the noise compensation unit of FIG. 3 in accordance with the embodiment of the present invention.

As illustrated in FIG. 4, the noise compensation unit 330 includes a noise compensation scaler 331 and a multiplier 332.

Hereinafter, the elements of the noise compensation unit 330 will be described in detail. The noise compensation scaler 331 determines the noise compensation scale according to the power variation control information generated by the power variation control unit 320.

The multiplier 332 multiplies the audio input signal by the noise compensation scale determined by the noise compensation scaler 331, and scales the audio input signal.

Figure 5:
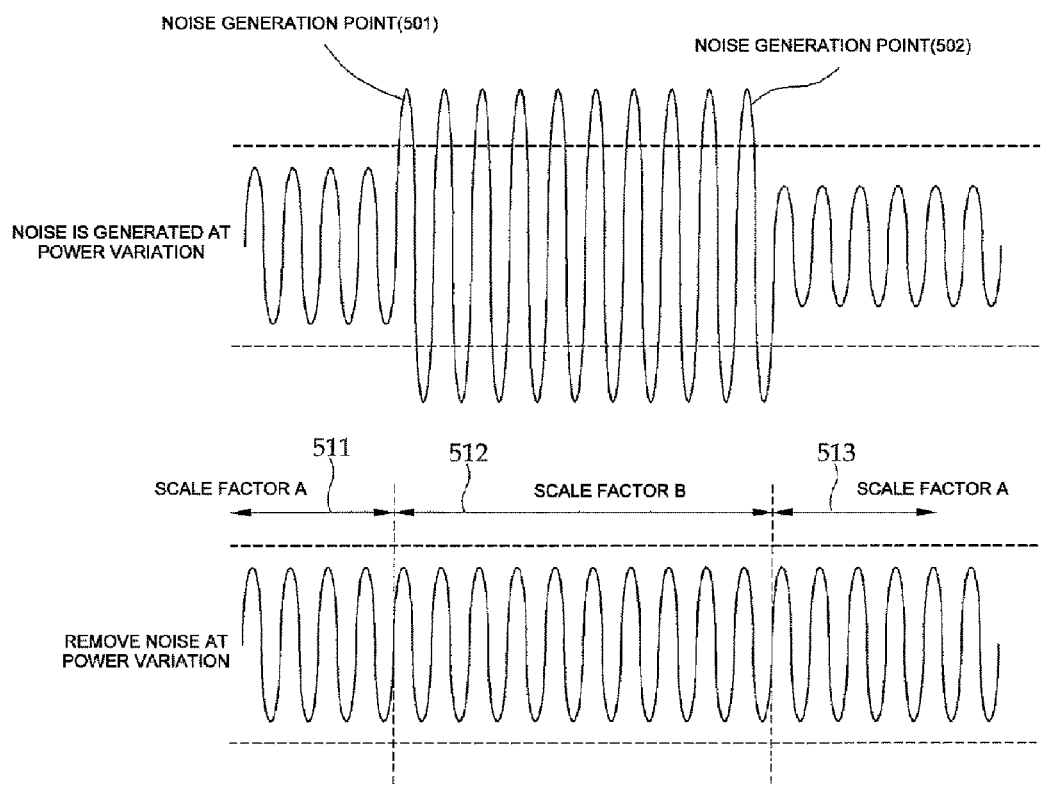
FIG. 5 is an exemplary diagram of a noise compensation process in a voltage variable type digital audio amplifying device in accordance with a first embodiment of the present invention.

FIG. 5 is an exemplary diagram of a noise compensation process in the voltage variable type digital audio amplifying device in accordance with the first embodiment of the present invention.

In the power variation unit 350, when noise compensation scale is not applied to the audio input signal at the power variation, noise is generated in the audio output signal. As illustrated in FIG. 5, a noise generation point 501 indicates the time point at which the power supply voltage is varied from the audio supply voltage A to the audio supply voltage B. Additionally, a noise generation point 502 indicates the time point at which the power supply voltage is varied from the audio supply voltage B to the audio supply voltage A.

In order to compensate for noise at the power variation through the first embodiment for the noise compensation process, the noise compensation unit 330 scales the audio input signal according to a scale factor A in a first interval 511. During a second interval 512 after the noise generation point 501, the noise compensation unit 330 scales the audio input signal according to a scale factor B. During a third interval 513 after the noise generation point 502, the noise compensation unit 330 scales the audio input signal according to the scale factor A. That is, the noise compensation unit 330 applies the scale factor A or B corresponding to the first to third intervals and scales the audio input signal, thereby removing noise at the power variation.

Figure 6:
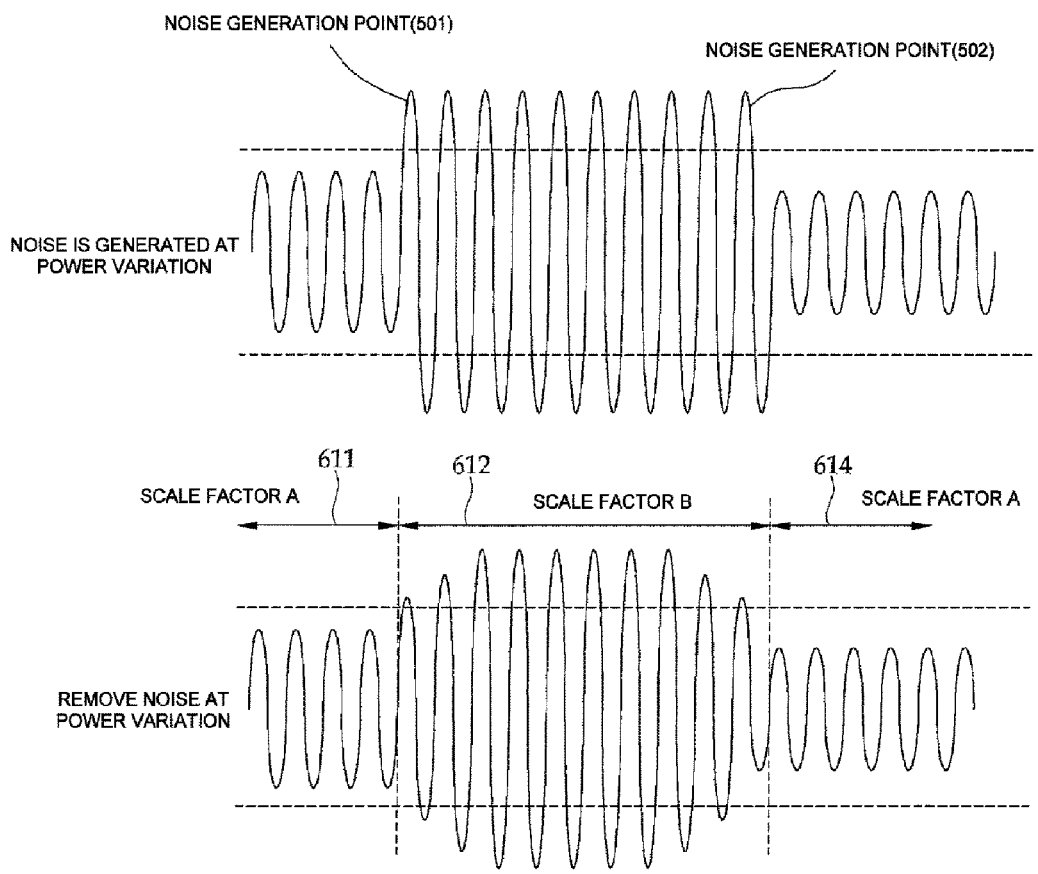
FIG. 6 is an exemplary diagram of a noise compensation process in a voltage variable type digital audio amplifying device in accordance with a second embodiment of the present invention.

FIG. 6 is an exemplary diagram of a noise compensation process in the voltage variable type digital audio amplifying device in accordance with the second embodiment of the present invention.

As illustrated in FIG. 6, when noise compensation scale is not applied to the audio input signal at power variation in the power variation unit 350, noise is generated in the audio output signal.

In order to compensate for noise at the power variation through the second embodiment for the noise compensation process, the noise compensation unit 330 scales the audio input signal according to a scale factor A in a first interval 511.

During a second interval 512 after a noise generation point 501, the noise compensation unit 330 determines a scale factor B such that the audio output signal is increased or decreased gradationally according to a cumulative variable time after the noise generation point 501. That is, the noise compensation unit 330 scales the audio input signal according to the determined scale factor B.

During a third interval 513 after the noise generation point 502, the noise compensation unit 330 scales the audio input signal according to the scale factor A.

Figure 7:
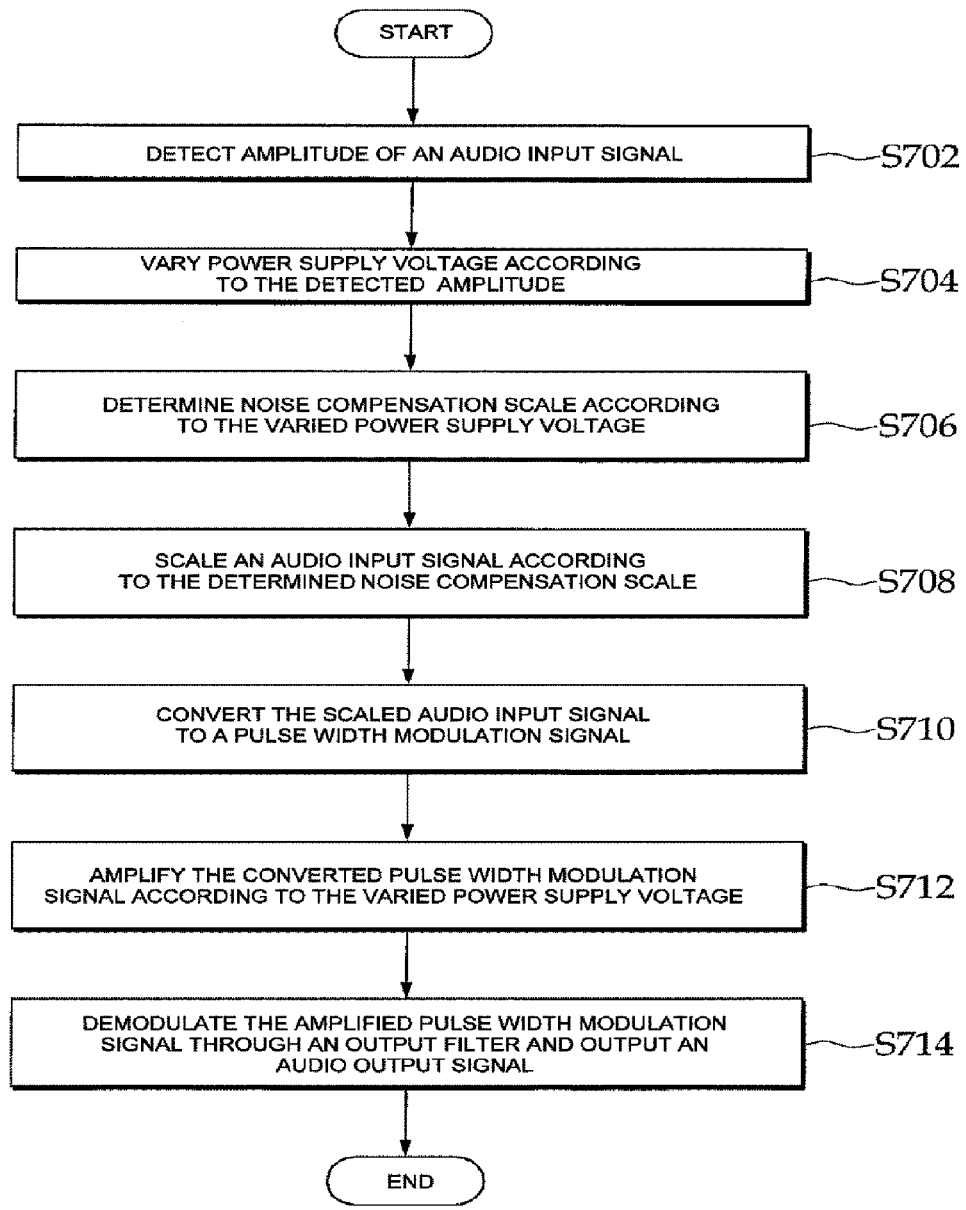
FIG. 7 is a flowchart of a voltage variable type digital audio amplifying device for noise compensation in accordance with an embodiment of the present invention.

FIG. 7 is a flowchart of the voltage variable type digital audio amplifying device for noise compensation in accordance with the embodiment of the present invention.

The amplitude detection unit 310 detects the amplitude of the audio input signal (S702).

Then, the power variation unit 350 varies a power supply voltage according to the amplitude detected by the amplitude detection unit 310 (S704).

Then, the noise compensation unit 330 determines a noise compensation scale according to the power supply voltage varied by the power variation unit 350 (S706). The noise compensation unit 330 may determine the noise compensation scale by using a power supply voltage ratio of the varied power supply voltage to the power supply voltage before being varied. Furthermore, the noise compensation unit 330 may determine the noise compensation scale such that the audio output signal is increased or decreased gradationally according to a cumulative variable time.

Subsequently, the noise compensation unit 330 scales the audio input signal according to the determined noise compensation scale (S708).

The pulse width modulation conversion unit 340 converts the audio input signal scaled by the noise compensation unit 330 to a pulse width modulation signal (S710).

Then, the amplification unit 360 amplifies the pulse width modulation signal converted by the pulse width modulation conversion unit 340 according to the varied power supply voltage (S712).

Subsequently, the output unit 370 demodulates the pulse width modulation signal amplified by the amplification unit 360 through an output filter, and outputs the audio output signal (S714).

So far, the present invention has been described with respect to the exemplary embodiments disclosed above. It can be understood by those skilled in the art that these embodiments may be implemented in modified forms without departing from the essential characteristics of the present invention. Therefore, the disclosed embodiment should be considered not to limit the present invention. The scope of the present invention is determined by the appended claims, and all differences within a range equivalent thereto should be construed as being included in the present invention.

The invention claimed is:

1. A voltage variable type digital audio amplifying device for noise compensation, comprising:
    an amplitude detection unit configured to detect an amplitude of an audio input signal;
    a noise compensation unit configured to scale the audio input signal according to a noise compensation scale;
    a pulse width modulation conversion unit configured to convert the scaled audio input signal to a pulse width modulation signal;
    an amplification unit configured to amplify the converted pulse width modulation signal according to a power supply voltage;
    an output unit configured to demodulate the amplified pulse width modulation signal through an output filter, and output an audio output signal;
    a power variation unit configured to vary the power supply voltage; and
    a power variation control unit configured to generate power variation control information for controlling power variation in the power variation unit according to the detected amplitude,
    wherein the noise compensation unit determines the noise compensation scale according to the generated power variation control information.

2. The voltage variable type digital audio amplifying device for noise compensation according to claim 1, wherein the noise compensation unit determines the noise compensation scale by using a power supply voltage ratio of the varied power supply voltage to the power supply voltage before being varied.

3. The voltage variable type digital audio amplifying device for noise compensation according to claim 1, wherein the noise compensation unit determines the noise compensation scale by changing a power supply voltage ratio of the varied power supply voltage to the power supply voltage before being varied.

4. The voltage variable type digital audio amplifying device for noise compensation according to claim 1, wherein, when the power supply voltage is varied, the noise compensation unit determines the noise compensation scale such that the audio output signal is increased or decreased gradationally according to a cumulative variable time.

5. The voltage variable type digital audio amplifying device for noise compensation according to claim 4, wherein the noise compensation unit varies a ratio, at which the audio output signal is increased or decreased gradationally according to the cumulative variable time, by using a preset compensation weighted value.

6. The voltage variable type digital audio amplifying device for noise compensation according to claim 1, wherein the noise compensation unit comprises:
    a noise compensation scaler configured to determine the noise compensation scale according to the generated power variation control information; and
    a multiplier configured to scale the audio input signal by multiplying the audio input signal by the determined noise compensation scale.

7. A voltage variable type digital audio amplifying method for noise compensation, comprising:
    an amplitude detection step of detecting an amplitude of an audio input signal;
    a power variation step of varying a power supply voltage according to the detected amplitude;
    a noise compensation step of determining a noise compensation scale according to the varied power supply voltage, and scaling the audio input signal according to the determined noise compensation scale;
    a pulse width modulation conversion step of converting the scaled audio input signal to a pulse width modulation signal;
    an amplification step of amplifying the converted pulse width modulation signal according to the varied power supply voltage; and
    an output step of demodulating the amplified pulse width modulation signal through an output filter, and outputting an output audio signal.

8. The voltage variable type digital audio amplifying method for noise compensation according to claim 7, wherein, in the noise compensation step, the noise compensation scale is determined using a power supply voltage ratio of the varied power supply voltage to the power supply voltage before being varied.

9. The voltage variable type digital audio amplifying method for noise compensation according to claim 7, wherein, in the noise compensation step, the noise compensation scale is determined by changing a power supply voltage ratio of the varied power supply voltage to the power supply voltage before being varied.

10. The voltage variable type digital audio amplifying method for noise compensation according to claim 7, wherein, in the noise compensation step, when the power supply voltage is varied, the noise compensation scale is determined such that the audio output signal is increased or decreased gradationally according to a cumulative variable time.

11. The voltage variable type digital audio amplifying method for noise compensation according to claim 10, wherein, in the noise compensation step, a ratio, at which the audio output signal is increased or decreased gradationally according to the cumulative variable time, is varied using a preset compensation weighted value.

* * * * *